(12) United States Patent
Mikami

(10) Patent No.: US 10,386,225 B2
(45) Date of Patent: Aug. 20, 2019

(54) SEMICONDUCTOR LIGHT RECEPTION MODULE

(71) Applicant: Mitsubishi Electric Corporation, Tokyo (JP)

(72) Inventor: Yohei Mikami, Nagasaki (JP)

(73) Assignee: Mitsubishi Electric Corporation, Tokyo (JP)

(*) Notice: Subject to any disclaimer, the term of this patent is extended or adjusted under 35 U.S.C. 154(b) by 116 days.

(21) Appl. No.: 15/592,304

(22) Filed: May 11, 2017

(65) Prior Publication Data
US 2018/0106667 A1 Apr. 19, 2018

(30) Foreign Application Priority Data
Oct. 13, 2016 (JP) ................. 2016-201558

(51) Int. Cl.
G01J 1/02 (2006.01)
G01J 1/04 (2006.01)
G01J 1/44 (2006.01)
G02B 6/26 (2006.01)
H01L 31/0203 (2014.01)
H01L 31/107 (2006.01)

(52) U.S. Cl.
CPC ........... *G01J 1/0271* (2013.01); *G01J 1/0214* (2013.01); *G01J 1/0411* (2013.01); *G01J 1/44* (2013.01); *G02B 6/262* (2013.01); *H01L 31/0203* (2013.01); *H01L 31/107* (2013.01); *G01J 2001/4466* (2013.01)

(58) Field of Classification Search
CPC ...... G01J 1/0271; G01J 1/0411; G01J 1/0214; G01J 2001/4466
See application file for complete search history.

(56) References Cited

U.S. PATENT DOCUMENTS 7,266,139 B2 * 9/2007 Haneda ............... G02B 6/4204
257/E31.128

FOREIGN PATENT DOCUMENTS

JP 03-059607 A 3/1991

OTHER PUBLICATIONS

An Office Action mailed by the Taiwanese Patent Office dated Jun. 19, 2018, which corresponds to Taiwanese Patent Application No. 106113888 and is related to U.S. Appl. No. 15/592,304.

* cited by examiner

Primary Examiner — Tony Ko
(74) Attorney, Agent, or Firm — Studebaker & Brackett PC

(57) ABSTRACT

A semiconductor light reception module is provided with a stem, a cap covering the stem, a holder superimposed on the cap, and a receptacle inserted into the holder. The holder has a main body section covering the lens in the cap. An opening passing from the opposite side of the cap through the main body section and reaching the lens is provided in the main body section of the holder. A fixing screw is inserted into a screw hole provided in the holder and a screw tip of a screw main body section of the fixing screw abuts against a side surface of the receptacle.

12 Claims, 12 Drawing Sheets

X1-X1' SECTION

X2-X2' SECTION

X3-X3' SECTION

SEMICONDUCTOR LIGHT RECEPTION MODULE

BACKGROUND

1. Technical Field

The present application relates to a semiconductor light reception module.

2. Description of the Related Art

Technology for adjusting the optical axis of a semiconductor light reception module is known in the prior art, as disclosed in Japanese Patent Application Publication No. H3-059607, for example. In this prior art document, an avalanche photodiode is used as a semiconductor light reception device. Below, the term "avalanche photodiode" is abbreviated simply as "APD".

In general, a semiconductor light reception module is obtained by assembling a semiconductor light reception device such as an APD, a lens and a receptacle. An optical signal is transmitted from an optical fiber installed in the receptacle to a light receiving surface of the semiconductor light reception device, via the lens.

The APD has the function of magnifying the optical current. However, the magnification rate is not uniform within the light receiving surface of the APD. Specifically, the magnification rate is different in the center and the outer periphery of the light receiving surface of the APD, hence, the light receiving surface of the APD has a distribution of various magnification rates.

In this respect, Japanese Patent Application Publication No. H3-059607 described above discloses a method for suitably adjusting the optical axis in a direction parallel to the light receiving surface of the APD, in other words, in the planar direction.

A semiconductor light reception device and lens have been packaged in a so-called CAN package format and the like and presented as a semiconductor light reception package. A semiconductor light reception module is provided by connecting a semiconductor light reception package of this kind is connected with a receptacle. When the semiconductor light reception module is used, an optical connector is connected detachably to the receptacle.

One of the structural specifications of a semiconductor light reception module is the module length. The module length is defined in terms of the length between a stem bottom surface of the semiconductor light reception package and a front end of the receptacle, or the length between the stem bottom surface of the semiconductor light reception package and a fixing flange of the receptacle. This module length is related to the mounting space and the fixing structure of the semiconductor light reception module. Conventionally, the module length of the semiconductor light reception module is determined first, and then the internal structure specifications, such as the focal distance of the lens and the APD chip-to-lens distance, are designed in accordance with this module length. Therefore, if the specified module length is different, then it has been necessary to change the design of the lens and the APD chip-to-lens distance.

SUMMARY

The present application was devised in view of the problems described above, an object thereof being to provide an improved semiconductor light reception module wherein the need for design modifications can be avoided as far as possible, even if the specified module length is different.

A semiconductor light reception module according to one aspect of this application includes a stem having a surface; a semiconductor light reception device provided on the surface of the stem; a cap-with-lens covering the semiconductor light reception device on the surface of the stem; a holder; and a receptacle. The holder has a main body section covering a lens of the cap-with-lens, and is provided with an opening that passes from a side opposite to the cap-with-lens through the main body section and reaches the lens. The receptacle has a front end section for exposing an end face of an optical fiber. The front end section is inserted into the opening of the holder. The holder further includes a fixing member to fix the receptacle to the holder and to release the fixing and to adjust a depth to which the front end section is inserted into the opening.

Other and further objects, features and advantages of the application will appear more fully from the following description.

DETAILED DESCRIPTION OF EMBODIMENTS

First Embodiment

Figure 1:
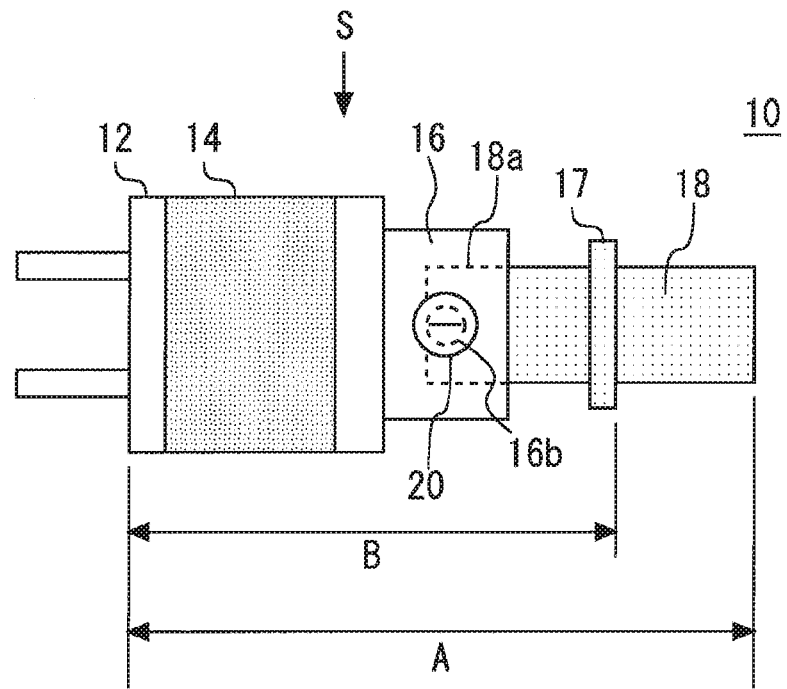
FIG. 1 is a diagram showing the configuration of a semiconductor light reception module according to a first embodiment.
Figure 2:
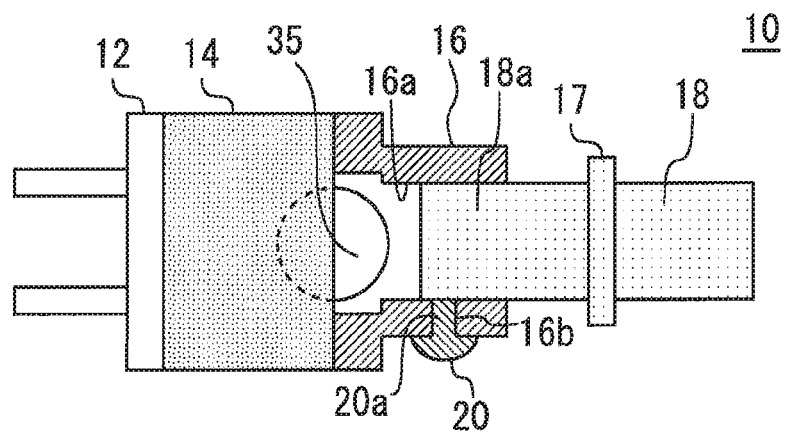
FIG. 2 is a diagram showing the configuration of the semiconductor light reception module according to a first embodiment.

FIG. 1 and FIG. 2 are diagrams showing the configuration of a semiconductor light reception module 10 according to a first embodiment. The semiconductor light reception module 10 is provided with a stem 12, a cap 14 which covers the stem 12, a holder 16 which is superposed on the cap 14, and a receptacle 18 which is inserted into the holder 16. A fixing flange 17 is provided on a lateral peripheral surface of the receptacle 18. The length A from a bottom surface of the stem 12 to an end portion of the receptacle 18, and the length B from the bottom surface of the stem 12 to the position of the fixing flange 17 can be determined respectively as specifications of the module length of the semiconductor light reception module 10.

FIG. 2 is a cross-sectional diagram of the holder 16 in a section along a plane parallel to the central axis of the receptacle 18, in which the semiconductor light reception module 10 is viewed in a direction perpendicular to the direction of insertion of a fixing screw 20, in other words, in the direction of arrow S in FIG. 1. The holder 16 has a main body section which covers the lens 35 on the cap 14. An opening 16a which passes from a side opposite to the cap 14 through the main body section and reaches the lens 35 is provided in the main body section of the holder 16. The fixing screw 20 is inserted into a screw hole 16b provided in the holder 16 and a screw tip of a screw main body section 20a of the fixing screw 20 abuts against a side surface of the receptacle 18.

Figure 3:
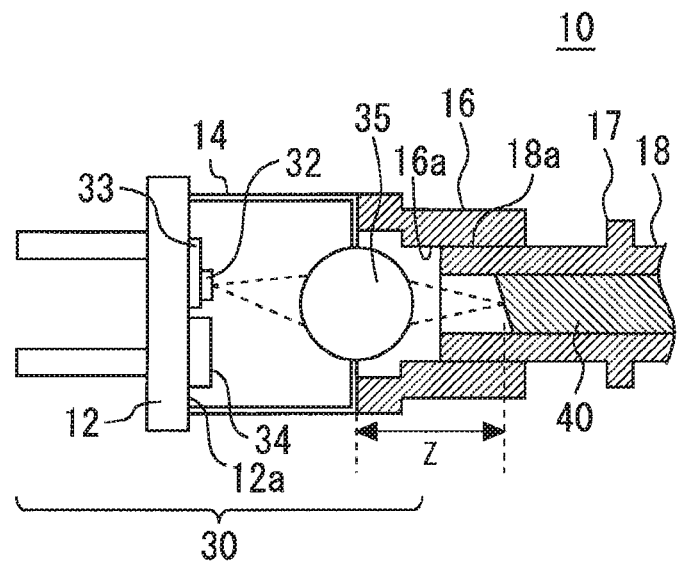
FIG. 3 is a diagram illustrating the internal configuration of the semiconductor light reception module according to the first embodiment.

FIG. 3 is a diagram illustrating the internal configuration of the semiconductor light reception module 10 according to the first embodiment. The stem 12 has a surface 12a. A sub-mount 33 and a pre-amp 34 are mounted on the surface 12a. An avalanche photodiode 32, which is a semiconductor light reception device in the present embodiment, is mounted on the sub-mount 33. Hereinafter, the "avalanche photodiode 32" may be abbreviated as "APD 32". The cap 14 covers the internal components of the package, such as the APD 32, the sub-mount 33 and the pre-amp 34, etc., on the surface 12a of the stem 12. The interior of the cap 14 is sealed, thereby providing a so-called CAN package. The cap 14 has a tubular shape and is provided with a cylindrical side surface section and a lid section which closes off an end of the side surface section. The lens 35 is provided in the lid section. The lens 35 may use, for example, a bowl lens having a refractive index of 1.5 and a diameter of 1.5 mm. A CAN package 30 is formed by assembling the stem 12, a component which is mounted on top of the surface 12a of the stem 12, the cap 14, and the lens 35. The CAN package 30 is provided as an individual component separately from the holder 16 and the receptacle 18.

The receptacle 18 is a cylindrical bar shape, and a long, thin cavity is formed therein. An optical fiber 40 is accommodated inside the receptacle 18. A front end section 18a is provided on one of the two ends of the receptacle 18. An end face of the optical fiber 40 in the receptacle 18 is exposed via the front end section 18a. The front end section 18a is inserted into the opening 16a in the holder 16. In the first embodiment, the illustration of the receptacle 18 is simplified, as shown in FIG. 3, but in a well-known receptacle in actual use, generally, an alignment sleeve is provided inside the receptacle, and an optical fiber housing stub is arranged inside this alignment sleeve. In the first embodiment, it is possible to use a well-known receptacle of this kind. The optical fiber 40 may be a single-mode fiber, for example.

The distance Z between the center of the lens 35 and the end face of the optical fiber 40 on the optical axis changes with movement of the receptacle 18 in the axial direction. If the distance Z changes, then it is possible to change the size of the beam which is condensed on a light receiving section 32a of the APD 32. In this way, it is possible to adjust the position of the optical fiber 40 and to align the core in the optical axis direction.

The holder 16 is provided with the fixing screw 20. The fixing screw 20 fixes the receptacle 18 to the holder 16 and also has the function, when loosened, of releasing the fixing of the receptacle 18 and adjusting the insertion depth of the front end section 18a into the opening 16a. The fixing screw 20 is not simply a fixing element, but rather fixes the receptacle 18 in a state where the front end section 18a is inserted to a desired depth in the opening 16a, within a certain range. The screw hole 16b reaching from the side surface of the main body section to the opening 16a is provided in the holder 16. The fixing screw 20 is installed in the screw hole 16b and the screw tip of the screw main body section 20a of the fixing screw 20 abuts against a side surface of the receptacle 18. By tightening the fixing screw 20, it is possible to fix the receptacle 18 in a simple fashion. Furthermore, if the fixing screw 20 is loosened, the fixing of the receptacle 18 is released, and therefore the receptacle 18 can be moved in the axial direction and the module length can be adjusted again.

Since the receptacle 18 is movable, it is possible to adjust the module length even after assembly of the semiconductor light reception module 10. In other words, since the receptacle 18 can be fixed to the holder 16 in a state where the front end section 18*a* has been inserted up to an appropriate depth in the opening 16*a*, then the semiconductor light reception module 10 in which the receptacle 18 can be moved in the axial direction is provided. Therefore, it is possible to adjust the whole length of the semiconductor light reception module 10 to different lengths. When the position of the front end section 18*a* is adjusted, the size of the beam condensed on the light receiving section 32*a* can also be changed, and therefore the core can be aligned in the perpendicular direction of the light receiving section 32*a* after assembly of the semiconductor light reception module 10. In other words, in structural terms, the receptacle 18 is inserted into the opening 16*a* which has an internal diameter of a size equal to or greater than the outer shape of the receptacle 18, and rather than fitting together tightly, a slight clearance is provided. The receptacle 18 can advance and retreat inside the opening 16*a*. When the fixing screw 20 is tightened, the screw tip abuts against the side surface of the receptacle 18, and the side surface of the receptacle 18 is pressed against the inner surface of the opening 16*a* in the holder 16, whereby the receptacle 18 is fixed.

Figure 4:
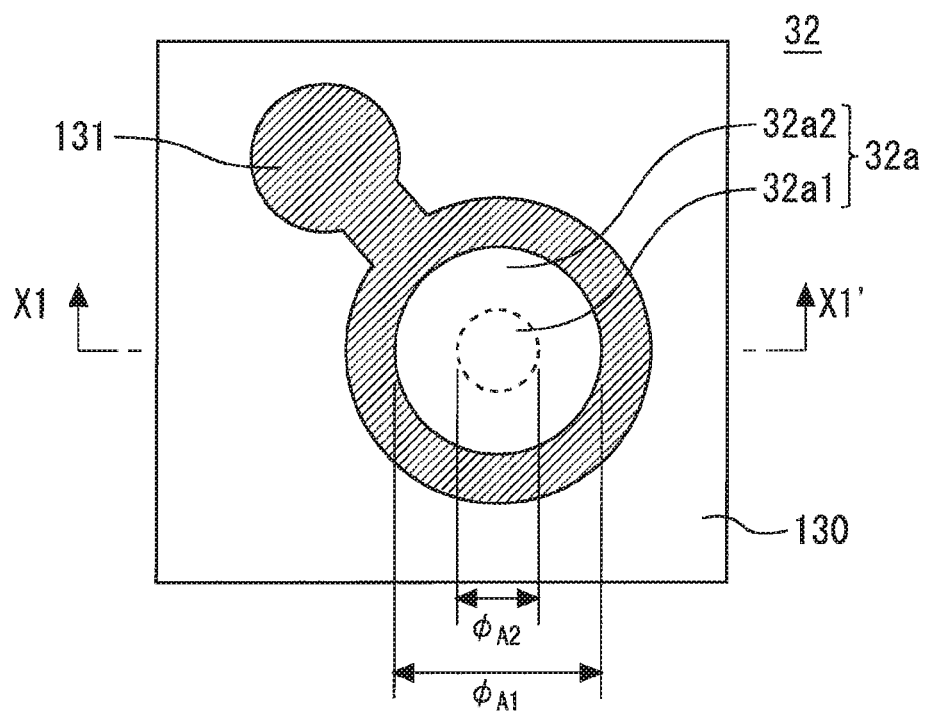
FIG. 4 is a plan diagram of the semiconductor light reception device of the semiconductor light reception module according to the first embodiment.

FIG. 4 is a plan diagram of the APD 32 of the semiconductor light reception module 10 according to the first embodiment. The APD 32 is a surface-input type of element, and is provided with the light receiving section 32*a*. The APD 32 comprises a window layer 130, a p electrode 131 and the light receiving section 32*a*. The p electrode 131 is provided on top of the window layer 130 and comprises an annular section and a bar-shaped section connected to this annular section. Although not shown in the drawings, a wire is connected to the front end of the bar-shaped section. As described below with reference to the cross-sectional drawing in FIG. 5, a plurality of semiconductor layers are provided on the side away from the viewer of FIG. 5 with respect to the window layer 130. The light receiving section 32*a* is a portion of the laminated body comprising the window layer 130 and the plurality of semiconductor layers, which is exposed via the annular section of the p electrode 131.

Figure 5:
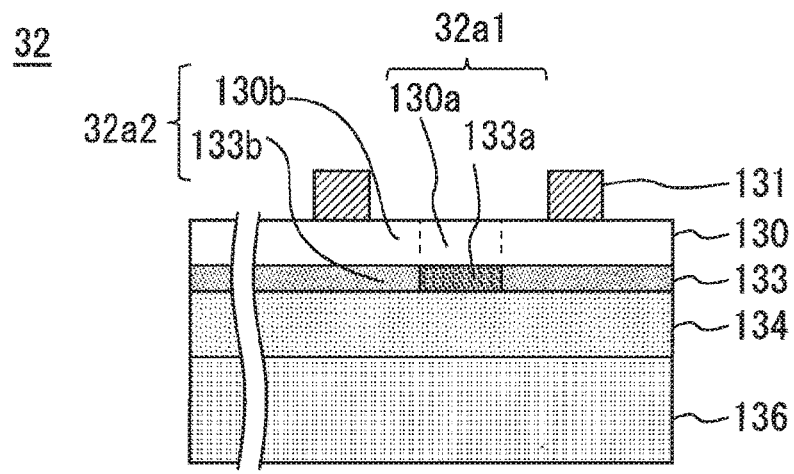
FIG. 5 is a cross-sectional diagram of the semiconductor light reception device of the semiconductor light reception module according to the first embodiment.

FIG. 5 is a cross-sectional diagram of the APD 32 of the semiconductor light reception module 10 according to the first embodiment. An absorbing layer 134, a magnification layer 133, the window layer 130 and the p electrode 131 are stacked on top of a semiconductor substrate 136. Although not shown in the drawings, an n electrode is provided on the lower side of the semiconductor substrate 136, in other words, on the rear surface side, and this n electrode is fixed to the sub-mount 33 by solder, or the like.

To describe the shape of the light receiving section 32*a* with reference to FIG. 4 and FIG. 5, firstly, the diameter $\phi_{A1}$ of the light receiving section 32*a* in a plan view of the APD 32 is 40 μm. Light incident on the center of the light receiving section 32*a* enters into the magnification layer 133 which is positioned below the window layer 130. The light receiving section 32*a* is divided into a central magnification section 32*a*1 and a peripheral magnification section 32*a*2. The diameter $\phi_{A2}$ of the central magnification section 32*a*1 when the APD 32 is observed in plan view is 20 μm. The outer side of the central magnification section 32*a*1 is a peripheral magnification section 32*a*2 and the peripheral magnification section 32*a*2 has an annular shape. When an inverse voltage is applied to the APD 32, the magnification rate of the central magnification section 32*a*1 is 1.2 times higher than the magnification rate of the peripheral magnification section 32*a*2.

A commonly known technique may be used for the method for imparting a magnification rate distribution within the plane of the light receiving section 32*a*, and therefore a detailed description is omitted here, but it is possible to use the following two types of method, for example.

In a first method, the carrier density in the magnification layer 133 of the light receiving section 32*a* is controlled. The magnification layer 133 is provided with a magnification layer central section 133*a* which constitutes the central magnification section 32*a*1, and a magnification layer peripheral section 133*b* which constitutes the peripheral magnification section 32*a*2. By altering the carrier density between the magnification layer central section 133*a* and the magnification layer peripheral section 133*b*, it is possible to achieve a magnification rate distribution such as that in the first embodiment.

In a second method, the metal ion diffusion density in the window layer 130 is controlled. When manufacturing the window layer 130, in general, metal ions are injected by diffusion. By controlling the diffusion depth in the light receiving section 32*a*, it is possible to impart an in-plane distribution to the magnification rate. In other words, the window layer 130 is provided with a window layer central section 130*a* which constitutes the central magnification section 32*a*1 and a window layer peripheral section 130*b* which constitutes the peripheral magnification section 32*a*2. By applying a difference to the diffusion depth, between the window layer central section 130*a* and the window layer peripheral section 130*b*, it is possible to impart an in-plane distribution to the magnification rate. In actual practice, even with devices that are designed to have a uniform in-plane distribution of the magnification rate, there are cases where APDs having a magnification rate distribution are manufactured due to temperature variation inside the diffusion oven. Therefore, the magnification rate distribution may be measured in advance, before incorporating the device into a product, and a device having a similar magnification rate distribution to that of the APD 32 of the first embodiment may be selected for use.

Figure 6:
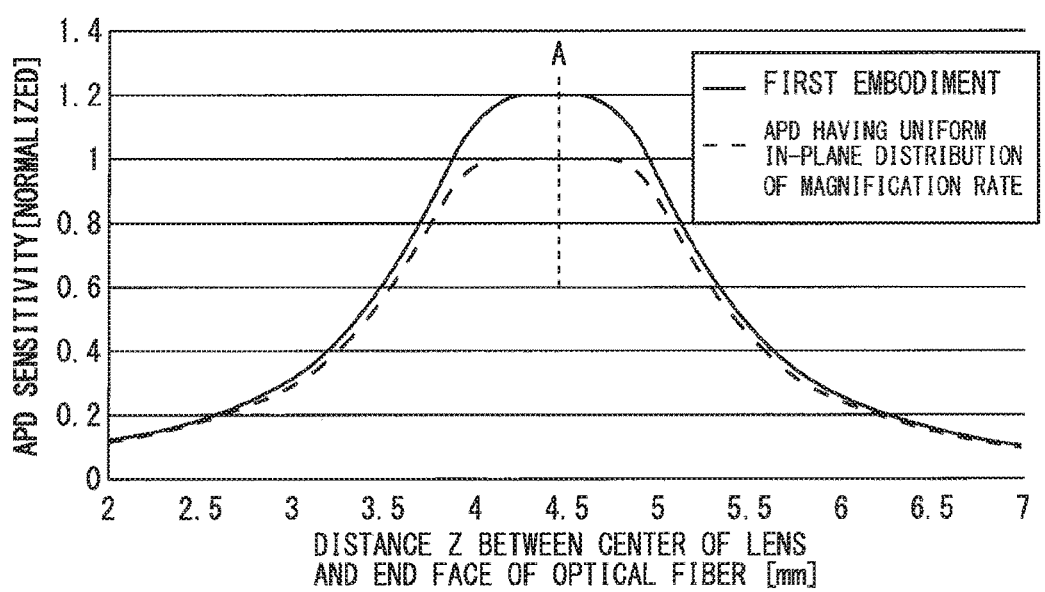
FIG. 6 is a graph showing an semiconductor light reception device sensitivity profile in the optical axis direction of the semiconductor light reception device of the semiconductor light reception module according to the first embodiment.

FIG. 6 is a graph showing an APD sensitivity profile in the optical axis direction of the APD 32 of the semiconductor light reception module 10 according to the first embodiment. An inverse voltage equal to or greater than the reach-through voltage and less than the breakdown voltage is applied to the APD 32. In this case, the optical fiber 40 is brought close to the lens 35. When the optical fiber 40 is then moved away from the lens 35 while keeping the center of the APD 32 aligned with the center of the beam incident on the APD 32, the APD sensitivity profile in the optical axis direction is as shown in FIG. 6. The dotted line in FIG. 6 is the APD sensitivity profile of the APD 32 which has a uniform magnification rate throughout the whole of a uniform light receiving section 32*a*, and when compared with this case, the first embodiment shows a narrowing of the sensitivity peak at the central point A of the APD sensitivity profile.

Figure 7:
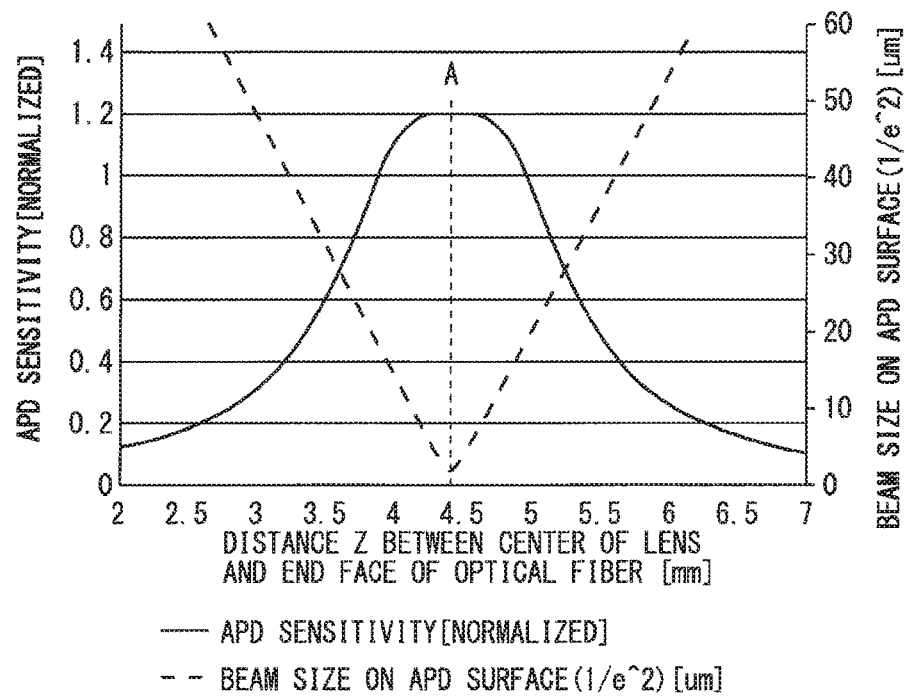
FIG. 7 is a graph showing the relationship between the semiconductor light reception device sensitivity profiles in the optical axis direction of the semiconductor light reception device of the semiconductor light reception module according to the first embodiment and the beam size on the light receiving section.

FIG. 7 is a graph showing the relationship between the APD sensitivity profiles in the optical axis direction of the APD 32 of the semiconductor light reception module 10 according to the first embodiment and the beam size on the light receiving section 32*a*. The beam size is a minimum, when the distance Z on the optical axis between the center of the lens 35 and the end face of the optical fiber 40 is approximately 4.4 mm. As the distance Z increases or decreases from Z=4.4 mm, the beam size becomes larger. In this respect, since the magnification rate is greater in the central section of the light receiving section 32*a*, in the APD 32 according to the first embodiment, then as shown in FIG. 7, the APD sensitivity has a narrow peak in the central portion of the APD sensitivity profile, in which the beam size of the incident light on the APD 32 is restricted. Compared to an APD which has a uniform magnification rate distribution as indicated by the broken line, the peak width in the central portion of the APD sensitivity profile is narrowed, and therefore it is possible to align the core of the receptacle 18 in a stable fashion with the optical axis direction, so as to obtain a distance Z that is near the center of the APD sensitivity profile. As a result of this, a beneficial effect is obtained in suppressing variation of the module length after assembly of the module.

According to the first embodiment described above, the receptacle 18 is movable in the optical axis direction and by removing the fixing screw 20 and moving the movable part in the optical axis direction, while monitoring the sensitivity of the APD 32, it is possible to change the module length after assembling the semiconductor light reception module 10. Consequently, it is possible to adjust the device to a desired APD 32 sensitivity and module length.

Furthermore, the APD 32 is provided with the central magnification section 32a1 which magnifies the light incident on the center of the light receiving section, and the peripheral magnification section 32a2 which is provided in the periphery of the central magnification section 32a1. The central magnification section 32a1 and the peripheral magnification section 32a2 have mutually different magnification rates. As shown in FIG. 5, the central magnification section 32a1 and the peripheral magnification section 32a2 are obtained as divided sections having different magnification rates inside the magnification layer 133, by modifying the structure of the magnification layer 133 provided in the APD 32. When the central magnification section 32a1 has a higher magnification rate than the peripheral magnification section 32a2, as in the first embodiment, then as indicated by the solid line in FIG. 6, the APD sensitivity profile in the optical axis direction has a narrower peak than when the in-plane magnification rate is uniform. Consequently, an advantage is obtained in that it is possible to narrow the range of the module length in which a maximum value of the APD sensitivity can be achieved, and large variation of the module length can be suppressed.

Figure 19:
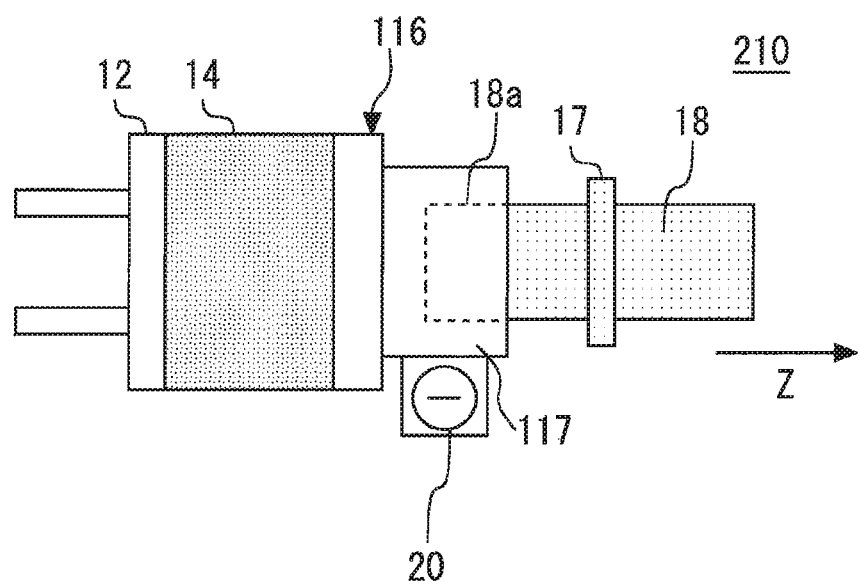
FIG. 19 is a diagram showing the configuration of a modification of the semiconductor light reception module according to the first embodiment.

Here, a semiconductor light reception module 210 according to a modification example is described with reference to FIG. 19. The fixing means for fixing the receptacle 18 to the holder 16 is not limited only to the fixing screw 20 as indicated in the first embodiment. For example, instead of the fixing screw 20, it would also be possible to use a holder 116 obtained by deforming the holder 16 so as to provide a well-known clamp mechanism of various types therein. In the holder 116 according to this modification example, the receptacle 18 is configured as a clamp section 117, and this clamp section 117 is fastened and fixed by the fixing screw 20 and a nut (not illustrated). Therefore, after the front end section 18a has been inserted to a desired depth into the opening 16a, the receptacle 18 may be fastened and fixed by the clamp section 117. More specifically, the clamp section 117 may clamp the receptacle 18 by means of a pillar clamp mechanism or a ring clamp mechanism such as that used generally in pipe joints. Examples of a fastening method for the clamp section 117 include fastening and fixing with a bolt and nut, installing a folding lever on a bolt head and fastening and fixing with a nut, and using a so-called quick-release clamp, or the like, in which members are fastened and fixed, and released, simply by opening and closing a quick-release lever.

The structure of the APD 32 is not limited to a planar-type APD. A mesa-type APD can also have a distribution imparted to the magnification rate in the light receiving section, and therefore the APD 32 may be substituted with a mesa-type APD.

In the first embodiment, the APD 32 in which a magnification rate distribution is generated in the light receiving section is used, but instead of this, it is also possible to adopt a modification example which uses a semiconductor light reception device having a uniform in-place magnification rate, such as that illustrated as a comparative example in FIG. 6. In the case of the present modification example, it is possible to increase the range of adjustment of the module length, compared to the first embodiment.

Second Embodiment

The semiconductor light reception module according to a second embodiment has a similar structure to the semiconductor light reception module 10 according to the first embodiment, except for the fact that the APD 32 is substituted with an APD 232. The APD 232 according to the second embodiment has a similar structure to the APD 32 of the first embodiment, except for the fact that the light receiving section 32a is substituted with a light receiving section 232a. Consequently, in the following description, parts of the configuration which are the same as or equivalent to the first embodiment are labelled with the same reference numerals, and the description here centers on the points of difference with respect to the first embodiment, the common matters being explained briefly or omitted from the description.

Figure 8:
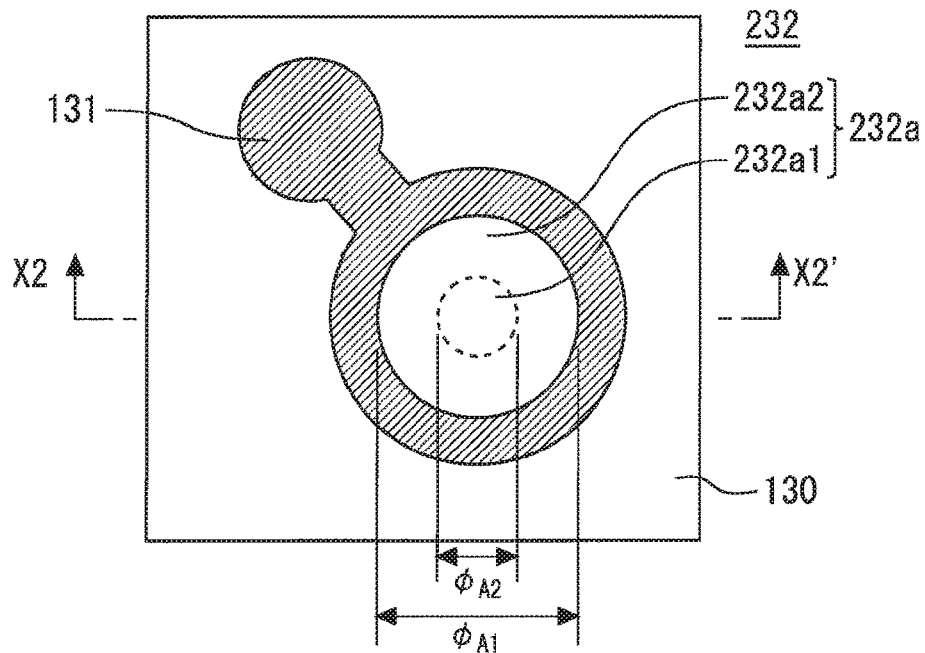
FIG. 8 is a plan diagram of the semiconductor light reception device of the semiconductor light reception module according to the second embodiment.
Figure 9:
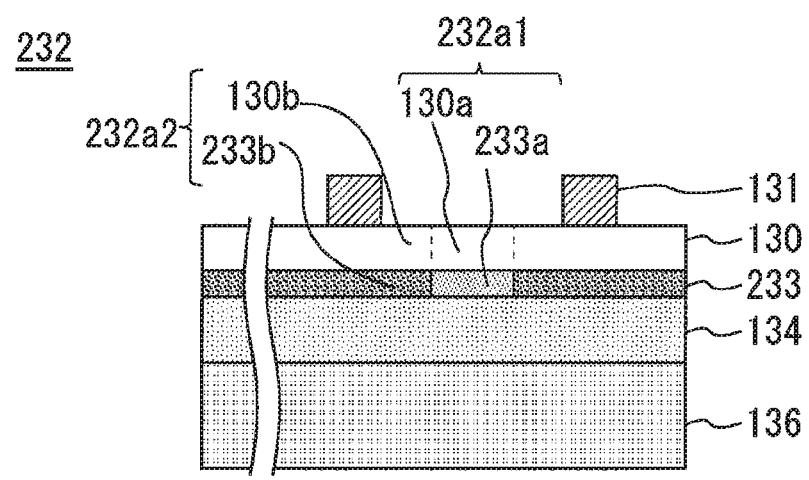
FIG. 9 is a cross-sectional diagram of the semiconductor light reception device of the semiconductor light reception module according to the second embodiment.

FIG. 8 is a plan diagram of the APD 232 of the semiconductor light reception module according to the second embodiment. In contrast to the first embodiment, in the second embodiment, the magnification rate of a central magnification section 232a1 is lower than the magnification rate of a peripheral magnification section 232a2. In other words, in a state where an inverse voltage is applied to the APD 232, the magnification rate of the peripheral magnification section 232a2 is 1.2 times higher than the magnification rate of the central magnification section 232a1. FIG. 9 is a cross-sectional diagram of the APD 232 of the semiconductor light reception module according to the second embodiment. In contrast to the magnification layer 133 of the first embodiment, the carrier density in the magnification layer 233 is adjusted such that a magnification layer peripheral section 233b has a higher magnification rate than a magnification layer central section 233a. As an example of a manufacturing method, it is possible to obtain the magnification rate distribution of the APD 232 of the second embodiment by inverting the relative size of the carrier density which is adjusted in the first embodiment. Furthermore, the diffusion depth into the window layer 130 may be controlled as described in the first embodiment, and by imparting a difference in the diffusion depth between the window layer central section 130a and the window layer peripheral section 130b, the magnification rate of the peripheral magnification section 232a2 can be made 1.2 times higher than the magnification rate of the central magnification section 232a1.

Figure 10:
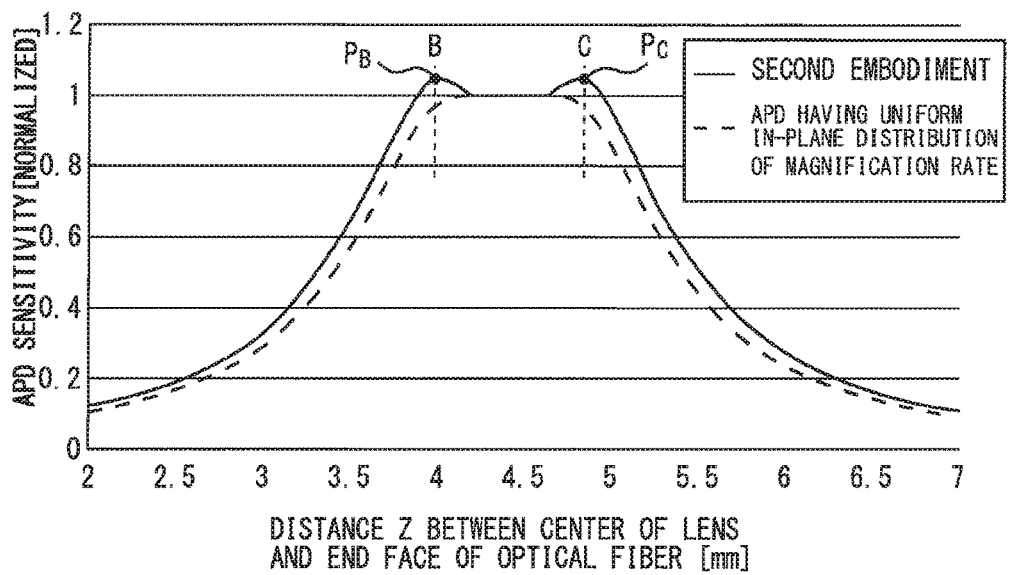
FIG. 10 is a graph showing an semiconductor light reception device sensitivity profile in the optical axis direction of the semiconductor light reception device of the semiconductor light reception module according to the second embodiment.

FIG. 10 is a graph showing an APD sensitivity profile in the optical axis direction of the APD 232 of the semiconductor light reception module according to the second embodiment. An inverse voltage equal to or greater than the reach-through voltage and less than the breakdown voltage is applied to the APD 232, the optical fiber 40 is brought close to the lens 35, and the optical fiber 40 is then moved away from the lens 35 while keeping the center of the light receiving section 232a aligned with the center of the incident beam. Therefore, the APD sensitivity profile in the optical axis direction is as shown in FIG. 10. The dotted line in FIG. 10 is a comparative example, and indicates the sensitivity profile for an APD which has a uniform magnification rate in the plane of the light receiving section 232a. When the dotted line and the solid line are compared, the APD 232 according to the second embodiment which is indicated by the solid line has two sensitivity peaks at both end of the top of the APD sensitivity profile. When the peripheral magnification section 232a2 has a higher magnification rate than the central magnification section 232a1 as in the second embodiment, then in contrast with a case where the magnification rate is uniform within the plane of the light receiving section 232a, the APD sensitivity profile in the optical axis direction has two maxima. When the receptacle 18 is moved in the optical axis direction, one of the two maxima is obtained when the module length is shortened, and the other of the two maximum is obtained when the module length is increased. Therefore, it is possible to provide a semiconductor light reception module which is capable of switching the module length in two stages having equal sensitivity.

Figure 11:
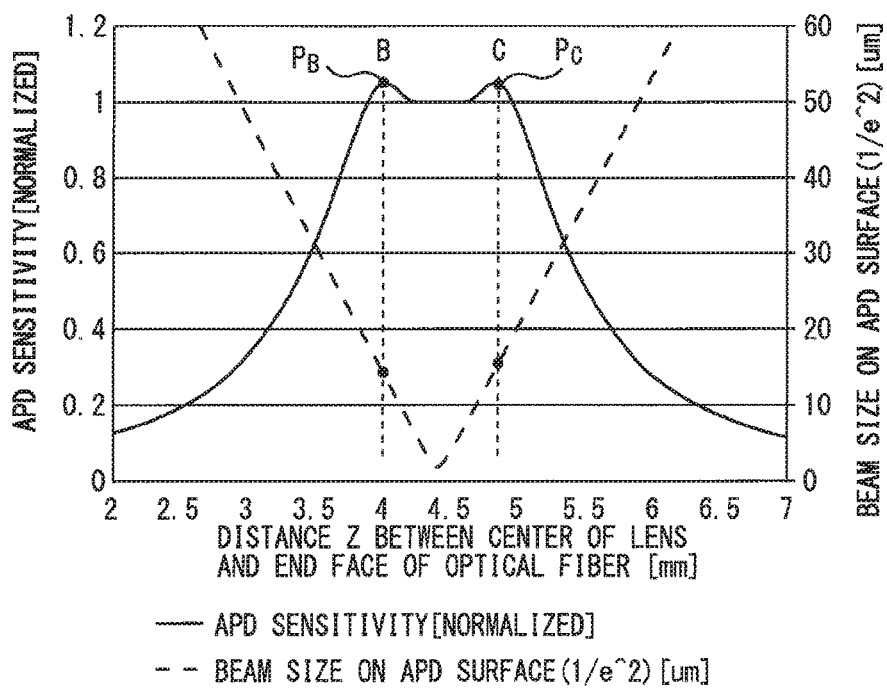
FIG. 11 is a graph showing the relationship between the semiconductor light reception device sensitivity profile in the optical axis direction of the semiconductor light reception device of the semiconductor light reception module according to the second embodiment and the beam size on the light receiving section.

FIG. 11 is a graph showing the relationship between the APD sensitivity profile in the optical axis direction of the APD 232 of the semiconductor light reception module according to the second embodiment and the beam size on the light receiving section 232a. As in FIG. 11, the beam size of the incident light on the APD 232 spreads towards both ends of the APD sensitivity profile. The overall APD sensitivity profile is upwardly convex and maximum values of the APD sensitivity are situated on both shoulders B, C of the convex shape. When compared with an APD having a uniform magnification rate distribution, there are peaks on both shoulders B, C of the APD sensitivity profile, in other words, at point $P_B$ and point $P_C$ in FIG. 10 and FIG. 11. Therefore, it is possible to align the core at point $P_B$ or point $P_C$, and an effect in suppressing variation of the module length is achieved in comparison with the case of the dotted line in FIG. 10, where there is no peak of this kind.

In other words, it is possible to align the core with the point $P_B$ by inserting the receptacle 18 to the maximum and then moving the receptacle 18 away, and it is also possible to align the core with the point $P_C$ by moving the receptacle 18 away as far as possible and then gradually inserting the receptacle. Therefore, it is possible to select two module lengths. Furthermore, the two sensitivity peaks each have a narrow peak width, and therefore the distance Z is readily determined by the specified length and the module length can be adjusted simply and accurately. Furthermore, the core can also be aligned in a state where the beam has spread on the light receiving section 232a, and therefore a stable light input tolerance can be achieved.

Third Embodiment

The semiconductor light reception module according to the third embodiment is provided with a similar structure to the semiconductor light reception module 10 according to the first embodiment, except for the fact that the APD 32 is substituted with an APD 332. The APD 332 according to the third embodiment is provided with a similar structure to the APD 232 according to the second embodiment, except for the fact that the light receiving section 232a is substituted with a light receiving section 332a. Consequently, in the following description, parts of the configuration which are the same as or equivalent to the first and second embodiments are labelled with the same reference numerals, and the description here centers on the points of difference with respect to the first and second embodiments, the common matters being explained briefly or omitted from the description.

Figure 12:
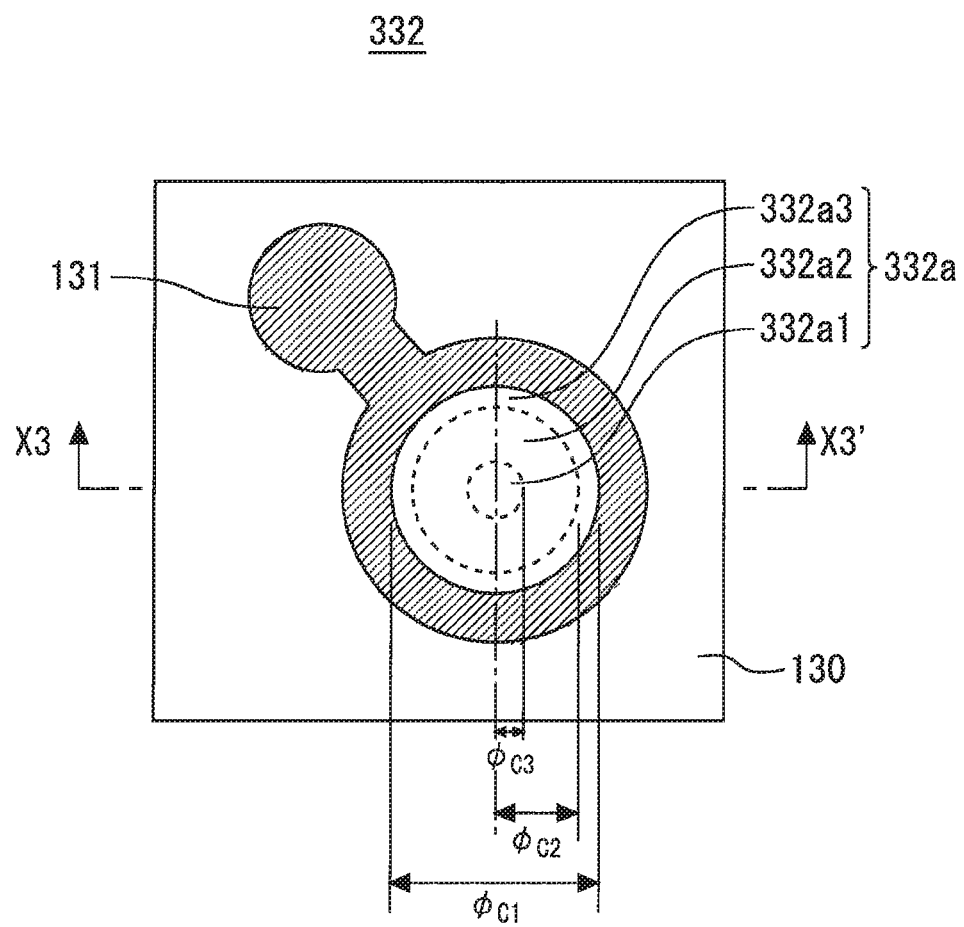
FIG. 12 is a plan diagram of the semiconductor light reception device of the semiconductor light reception module according to the third embodiment.

FIG. 12 is a plan diagram of the APD 332 of the semiconductor light reception module according to the third embodiment. The APD 332, similarly to the APD 232 according to the second embodiment, is provided with a central magnification section 332a1 and a peripheral magnification section 332a2. However, the APD 332 differs from the second embodiment in that an end magnification section 332a3 having a lower magnification rate than the peripheral magnification section 332a2 is provided further to the outside of the peripheral magnification section 332a2.

In a plan view of the APD 332 shown in FIG. 12, the diameter $\phi_{C1}$ of the light receiving section 332a is 40 μm. The region up to a radius of $\phi_{C3}$=5 μm from the center of the light receiving section 332a is the central magnification section 332a1. The annular region having an outer peripheral radius of $\phi_{C2}$=15 μm on the outside of the central magnification section 332a1 is the peripheral magnification section 332a2. The annular region further to the outside of the peripheral magnification section 332a2 is the end magnification section 332a3. In a state where an inverse voltage is applied to the APD 332, the magnification rate of the peripheral magnification section 332a2 is 1.2 times higher than the magnification rate of the central magnification section 332a1 and the end magnification section 332a3.

Figure 13:
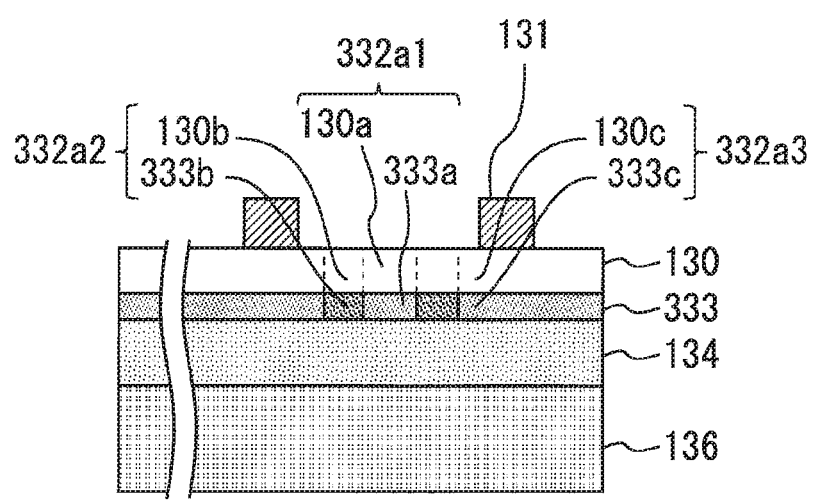
FIG. 13 is a cross-sectional diagram of the semiconductor light reception device of the semiconductor light reception module according to the third embodiment.

FIG. 13 is a cross-sectional diagram of the APD 332 of the semiconductor light reception module according to the third embodiment. The structure is similar to the APD 232 of the second embodiment, except for the fact that the magnification layer 233 is substituted with a magnification layer 333. The magnification layer 333 is provided with a magnification layer central section 333a which constitutes the central magnification section 332a1, a magnification layer peripheral section 333b which constitutes the peripheral magnification section 332a2, and a magnification layer end section 333c which constitutes the end magnification section 332a3. By adjusting the carrier density of the magnification layer central section 333a, the magnification layer peripheral section 333b and the magnification layer end section 333c, it is possible to obtain the abovementioned magnification rate distribution that is to be achieved by the APD 332 of the third embodiment. More specifically, it is possible to achieve the abovementioned magnification rate distribution by altering the mask pattern used in carrier injection. Furthermore, it is also possible to obtain a desired magnification rate distribution by applying a difference in the diffusion depth, between the window layer central section 130a, the window layer peripheral section 130b and a window layer end section 130c in the window layer 130.

Figure 14:
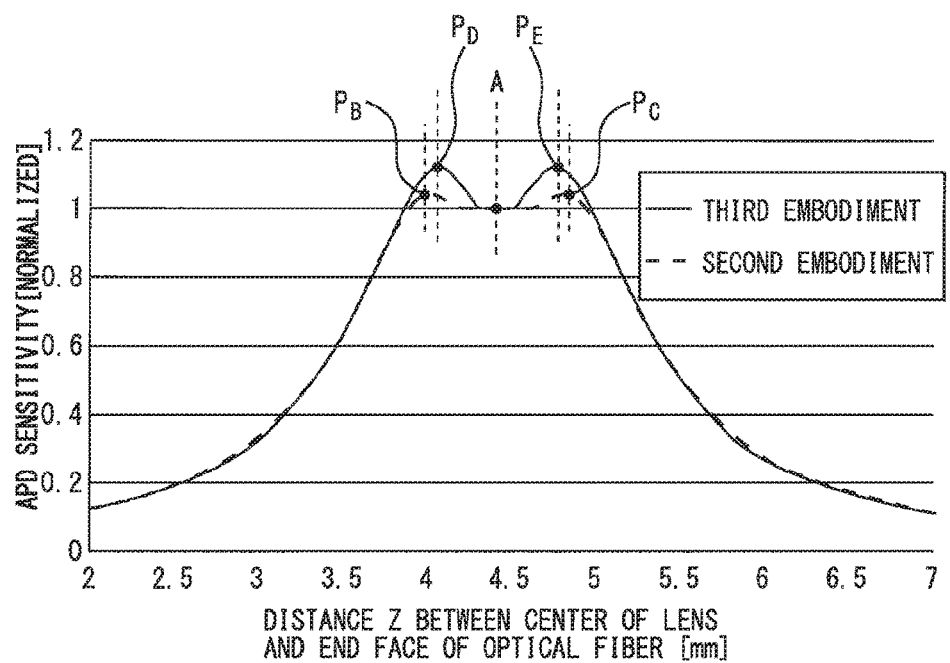
FIG. 14 is a graph showing an semiconductor light reception device sensitivity profile in the optical axis direction of the semiconductor light reception device of the semiconductor light reception module according to the third embodiment.

FIG. 14 is a graph showing an APD sensitivity profile in the optical axis direction of the APD 332 of the semiconductor light reception module according to the third embodiment. An inverse voltage equal to or greater than the reach-through voltage and less than the breakdown voltage is applied to the APD 332, the optical fiber 40 is moved near the lens 35, and the optical fiber 40 is then moved away from the lens 35 while keeping the center of the light receiving section 332a aligned with the center of the incident beam. In this case, the APD sensitivity profile in the optical axis direction is as shown in FIG. 14. The dotted line is shown for the purpose of comparison, and depicts the APD sensitivity profile of the APD 232 according to the second embodiment. When compared with the dotted line, in the third embodiment which is depicted by the solid line, a sensitivity peak is formed at point $P_D$ and point $P_E$ which are at positions displaced from point $P_B$ and point $P_C$, which are the sensitivity peaks. By controlling the positions and widths of the annular regions, and the magnification rate of the annular regions, it is possible to form one sensitivity peak respectively at any desired point between the central point A and the point $P_E$ and at any desired point between the central point A and the point $P_C$, in the APD sensitivity profiles shown in FIG. 14. By controlling the position, size and magnification rate of the annular peripheral magnification section 332a2 of the light receiving section 332a, it is possible to form a sensitivity peak at any position, as shown in FIG. 14. Furthermore, similarly to the second embodiment, it is possible to switch the module length of the semiconductor light reception module in two stages. When the end magnification section 332a3 having a lower magnification rate than the peripheral magnification section 332a2 is also provided as described above, point $P_D$ and point $P_E$ which are the two sensitivity maximum values have a larger value than when the end magnification section 332a3 is not provided, and furthermore, the interval between point $P_D$ and point $P_E$ is narrower than the interval between point $P_B$ and point $P_C$. In this way, by providing the end magnification section 332a3, it is possible to control the size of the sensitivity maximum values and the interval between the two sensitivity maximum values.

Fourth Embodiment

A semiconductor light reception module 410 according to the fourth embodiment is provided with a similar structure to the semiconductor light reception module 10 according to the second embodiment, except for the fact that a light shielding mask 435 is provided on the lens 35. Therefore, parts of the configuration which are the same as or equivalent to the second embodiment are labelled with the same reference numerals, and the description here centers on the points of difference with respect to the second embodiment, the common matters being explained briefly or omitted from the description.

Figure 15:
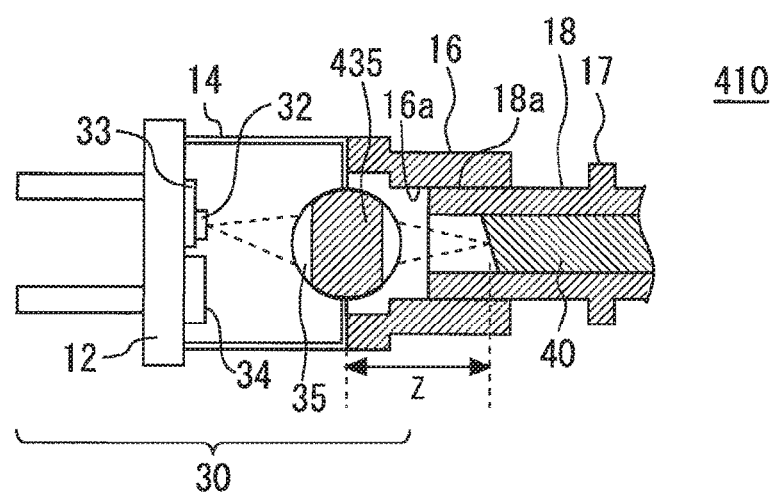
FIG. 15 is a diagram for illustrating the internal configuration of the semiconductor light reception module according to the fourth embodiment.
Figure 16:
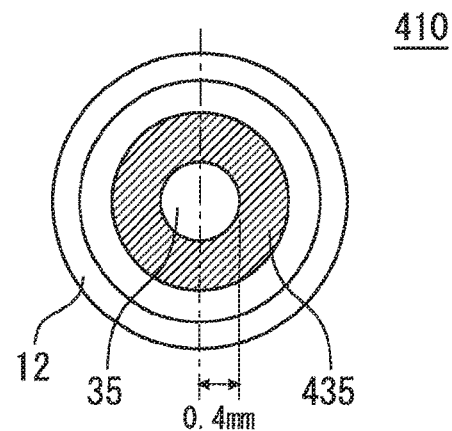
FIG. 16 is a diagram of the semiconductor light reception module according to the fourth embodiment, as viewed from the lens side.

FIG. 15 is a diagram for illustrating the internal configuration of the semiconductor light reception module 410 according to the fourth embodiment. A light shielding mask 435 is provided on the lens 35. FIG. 16 is a diagram of the semiconductor light reception module 410 according to the fourth embodiment, as viewed from the lens side. In other words, FIG. 16 shows a plan view of the surface of the lens 35 as observed parallel to the optical axis passing through the center of the optical fiber 40 and the center of the lens 35. In the plan view in FIG. 16, the light shielding mask 435 covers the outer periphery of the lens 35 and exposes the center of the lens 35. In the fourth embodiment, the light shielding mask 435 covers a region 0.4 mm or more to the outside of the center of the lens 35. The light shielding mask 435 may be formed by chrome coating, or the like, for example. The material of the light shielding mask 435 may be a material having low light transmissivity with respect to the wavelength of the light signal transmitted by the optical fiber 40. Furthermore, in the fourth embodiment, a spherical lens is used as the lens 35, and therefore the reflected light is diffused and it is thought that there is little effect of return light.

Figure 17:
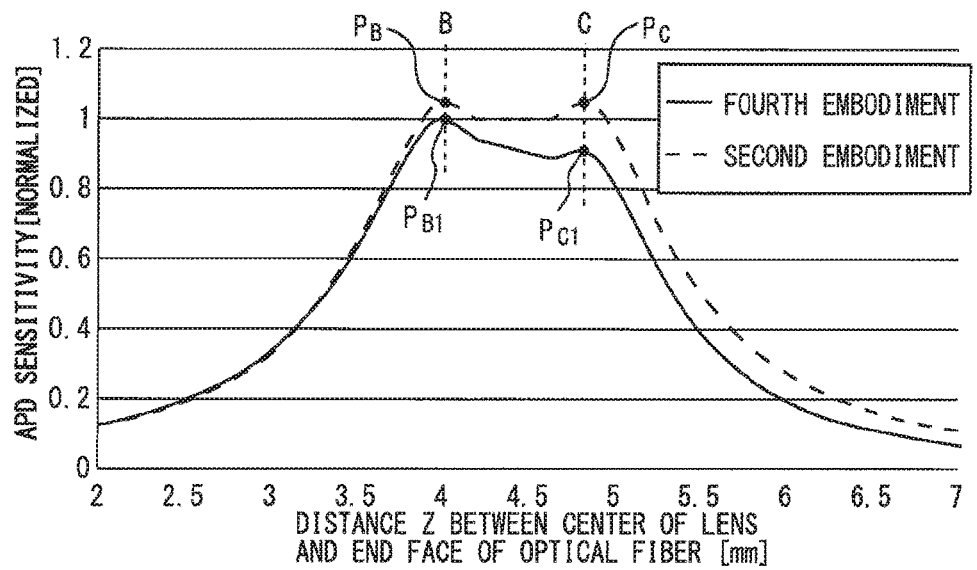
FIG. 17 is a graph showing an semiconductor light reception device sensitivity profile in the optical axis direction of the semiconductor light reception device of the semiconductor light reception module according to the fourth embodiment.
Figure 18:
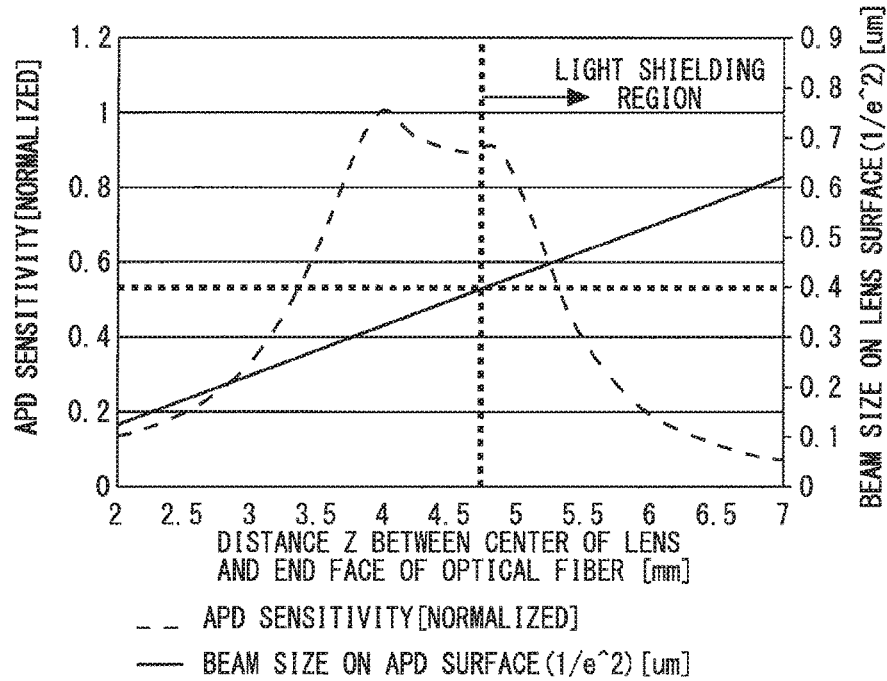
FIG. 18 is a graph showing the relationship between the semiconductor light reception device sensitivity profile in the optical axis direction of the semiconductor light reception device of the semiconductor light reception module according to the fourth embodiment and the beam size on the light receiving section.

FIG. 17 is a graph showing an APD sensitivity profile in the optical axis direction of the APD 32 of the semiconductor light reception module 410 according to the fourth embodiment. FIG. 18 is a graph showing the relationship between the APD sensitivity profile in the optical axis direction of the APD 32 of the semiconductor light reception module 410 according to the fourth embodiment and the beam size on the light receiving section 32a. As the optical fiber 40 is moved away from the lens 35, the beam diameter on the surface of the lens 35 becomes larger. Eventually, when the beam diameter reaches a size greater than the open region of the light shielding mask 435, the light is not able to pass readily. When the distance Z exceeds approximately 4.7 mm as shown in FIG. 18, a portion of the beam strikes the light shielding mask 435. In FIG. 18, the light shielding region is indicated by the region on the side where the optical fiber 40 has been moved away and the distance Z has become large enough for a portion of the beam to strike the light shielding mask 435. In this light shielding region, the APD sensitivity can be reduced to a greater extent, and therefore it is possible to create a size relationship between the two peaks of the APD sensitivity profile. In other words, there is only one maximum value, at point $P_{B1}$, in the ranges shown in FIG. 17 and FIG. 18.

The effects of the fourth embodiment are now described. Firstly, when the position of the front end section 18a is adjusted in the axial direction of the receptacle 18, the distance Z can be adjusted. Therefore, it is possible to change the size of the beam that is condensed on the light receiving section 32a. In this respect, when the distance Z is increased and the optical fiber 40 is moved away from the lens 35, then eventually the beam diameter on the surface of the lens 35 becomes large enough to strike the light shielding mask 435. As a result of this, on the side where the optical fiber 40 is moved away from the lens 35 by a prescribed distance or more, the APD sensitivity decreases more significantly compared to when there is no light shielding mask 435. When the position of the receptacle 18 is adjusted while monitoring the APD sensitivity, it is possible to accurately distinguish whether the optical fiber 40 is close to or far from the lens 35. Therefore, it is possible to align the core accurately in the optical axis direction. In other words, in the fourth embodiment, as shown in FIG. 17, the APD sensitivity profile in the optical axis direction has two sensitivity maxima of different magnitudes at point $P_{B1}$ and point $P_{C1}$. On the side where the module length is shortened, a large maximum value is obtained at point $P_{B1}$ and on the side where the module length is lengthened, a small maximum value is obtained at point $P_{C1}$. Therefore, the direction of adjustment of the module length can be ascertained easily when adjusting the module length while measuring the APD sensitivity.

In the light shielding mask 435, apart from the method of coating the surface of the lens 35 with a light shielding material, it is also possible to achieve a similar light shielding function by, for example, arranging an annular light shielding member between the lens 35 and the optical fiber 40 so as to shield a portion of the beam.

The light shielding mask 435 according to the fourth embodiment is not limited to application to the semiconductor light reception module according to the second embodiment, and may also be applied to the semiconductor light reception module 10 of the first embodiment or the semiconductor light reception module of the third embodiment.

The features and advantages of the present invention may be summarized as follows. According to one aspect of the present application, since the receptacle is movable in the optical axis direction, then it is possible to adjust the module length, even after assembly of the semiconductor light reception module.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2016-201558, filed on Oct. 13, 2016 including specification, claims, drawings and summary, on which the Convention priority of the present application is based, is incorporated herein by reference in its entirety.

What is claimed is:

1. A semiconductor light reception module, comprising:
a stem having a surface;
a semiconductor light reception device provided on the surface of the stem;
a cap-with-lens covering the semiconductor light reception device on the surface of the stem;
a holder having a main body section covering a lens of the cap-with-lens, and provided with an opening that passes from a side opposite to the cap-with-lens through the main body section and reaches the lens; and
a receptacle having a front end section for exposing an end face of an optical fiber, the front end section being inserted into the opening of the holder,
wherein the holder further comprises a fixing member configured to fix the receptacle to the holder, configured to release the fixing configured to adjust a distance between a center of the lens and the end face of the optical fiber on an optical axis of the optical fiber with movement of the receptacle in an axial direction of the optical axis.

2. The semiconductor light reception module according to claim 1, wherein
a screw hole extending from a side surface of the main body section to the opening is provided in the holder; and
the fixing member includes a fixing screw which is installed in the screw hole and, a screw tip of which abuts against a side surface of the receptacle.

3. The semiconductor light reception module according to claim 1, wherein the end face of the optical fiber is recessed into the receptacle so as to be a spaced distance apart from an end face of the receptacle.

4. A semiconductor light reception module, comprising:
a stem having a surface;
a semiconductor light reception device provided on the surface of the stem;
a cap-with-lens covering the semiconductor light reception device on the surface of the stem;
a holder having a main body section covering a lens of the cap-with-lens, and provided with an opening that passes from a side opposite to the cap-with-lens through the main body section and reaches the lens; and
a receptacle having a front end section for exposing an end face of an optical fiber, the front end section being inserted into the opening of the holder,
wherein the holder further comprises a fixing member to fix the receptacle to the holder and to release the fixing and to adjust a depth to which the front end section is inserted into the opening;
the semiconductor light reception device is an avalanche photodiode;
the semiconductor light reception device has a central magnification section that magnifies light incident on a center of a light receiving section, and a peripheral magnification section that is provided at a periphery of the central magnification section; and
the central magnification section and the peripheral magnification section have mutually different magnification rates.

5. The semiconductor light reception module according to claim 4, wherein the magnification rate of the central magnification section is higher than the magnification rate of the peripheral magnification section.

6. The semiconductor light reception module according to claim 4, wherein the magnification rate of the central magnification section is lower than the magnification rate of the peripheral magnification section.

7. The semiconductor light reception module according to claim 6, wherein an end magnification section having a lower magnification rate than the peripheral magnification section is further provided to an outside of the peripheral magnification section.

8. The semiconductor light reception module according to claim 4, wherein the end face of the optical fiber is recessed into the receptacle so as to be a spaced distance apart from an end face of the receptacle.

9. A semiconductor light reception module, comprising:
a stem having a surface;
a semiconductor light reception device provided on the surface of the stem;
a cap-with-lens covering the semiconductor light reception device on the surface of the stem;
a holder having a main body section covering a lens of the cap-with-lens, and provided with an opening that passes from a side opposite to the cap-with-lens through the main body section and reaches the lens; and
a receptacle having a front end section for exposing an end face of an optical fiber, the front end section being inserted into the opening of the holder,
wherein the holder further comprises a fixing member to fix the receptacle to the holder and to release the fixing and to adjust a depth to which the front end section is inserted into the opening;
the semiconductor light reception module further comprising a light shielding mask covering an outer periphery of the lens and exposing a center of the lens, in a plan view of the surface of the lens when observed in parallel with an optical axis passing through a center of the optical fiber and the center of the lens.

10. The semiconductor light reception module according to claim 9, wherein the end face of the optical fiber is recessed into the receptacle so as to be a spaced distance apart from an end face of the receptacle.

11. A semiconductor light reception module, comprising:
a stem having a surface;
a semiconductor light reception device provided on the surface of the stem;
a cap-with-lens covering the semiconductor light reception device on the surface of the stem;
a holder having a main body section covering a lens of the cap-with-lens, and provided with an opening that passes from a side opposite to the cap-with-lens through the main body section and reaches the lens; and
a receptacle having a front end section for exposing an end face of an optical fiber, the front end section being inserted into the opening of the holder,
wherein the holder further comprises fixing means configured for fixing the receptacle to the holder, configured for also releasing the fixing configured for adjusting a distance between a center of the lens and the end face of the optical fiber on an optical axis of the optical fiber with movement of the receptacle in an axial direction of the optical axis.

12. The semiconductor light reception module according to claim 11, wherein the end face of the optical fiber is recessed into the receptacle so as to be a spaced distance apart from an end face of the receptacle.

* * * * *